United States Patent
Kanev et al.

(10) Patent No.: US 7,733,108 B2
(45) Date of Patent: Jun. 8, 2010

(54) METHOD AND ARRANGEMENT FOR POSITIONING A PROBE CARD

(75) Inventors: Stojan Kanev, Thiendorf OT Sacka (DE); Hans-Jurgen Fleischer, Preistewitz (DE); Stefan Kressig, Venusberg (DE); Jorg Kiesewetter, Thiendorf OT Sacka (DE)

(73) Assignee: SUSS Microtec Test Systems GmbH, Sacka (DE)

( * ) Notice: Subject to any disclaimer, the term of this patent is extended or adjusted under 35 U.S.C. 154(b) by 0 days.

(21) Appl. No.: 12/329,968

(22) Filed: Dec. 8, 2008

(65) Prior Publication Data
US 2009/0085595 A1   Apr. 2, 2009

Related U.S. Application Data

(63) Continuation of application No. 11/947,129, filed on Nov. 29, 2007, now abandoned.

(30) Foreign Application Priority Data
Jul. 17, 2007   (DE) ............... 10 2007 033 617

(51) Int. Cl.
*G01R 31/02* (2006.01)
(52) U.S. Cl. ............... 324/758; 324/754; 324/756
(58) Field of Classification Search ............... None
See application file for complete search history.

(56) References Cited

U.S. PATENT DOCUMENTS

| 5,091,692 A | 2/1992 | Ohno et al. |
| 5,416,592 A * | 5/1995 | Mori et al. ............... 356/399 |
| 6,356,093 B2 * | 3/2002 | Nishikawa et al. ........... 324/758 |

* cited by examiner

*Primary Examiner*—Minh N Tang
(74) *Attorney, Agent, or Firm*—Hesin Rothenberg Farley & Mesiti P.C.

(57) ABSTRACT

A method for perpendicular positioning of a probe card relative to a test substrate, includes storing a separation position approached in a first positioning step as a distance between the needle tips of the probe card and the substrate, storing a contact position approached in a second positioning step until the probe card contacts the substrate, and displaying an image of the needle tips. For avoiding erroneous operation after a probe card has been changed, when imaging the needle tips, the stored contact position is imaged and is changed until presentation of this contact position corresponds to actual height of the tips appropriate for the respective probe card and this setting is then stored as a new contact position. A display device presents the needle tips and the stored contact position and is connected to a memory, a recording device and an input device which changes the contact position.

14 Claims, 6 Drawing Sheets

METHOD AND ARRANGEMENT FOR POSITIONING A PROBE CARD

CROSS REFERENCE TO RELATED APPLICATIONS

This application is a continuation of U.S. Ser. No. 11/947,129, filed Nov. 29, 2007, now abandoned, and claims priority from German patent application No. 10 2007 033 617.0, filed on Jul. 17, 2007, the entire disclosures of which are hereby incorporated herein by reference.

BACKGROUND ART

The invention relates to a method for positioning a probe card with probe needles, which have needle tips, relative to the surface of a substrate to be tested in a direction perpendicular to the surface of the substrate. In this case, a first position of the needle tips relative to the surface of the substrate is measured and stored as a separation position in such a manner that it is approached in a first positioning step, which does not measure the distance between the needle tips and the surface of the substrate, so as to produce a distance between the needle tips and the surface of the substrate. Furthermore, a second position of the needle tips relative to the surface of the substrate is measured and stored as a contact position in such a manner that it is approached in a second positioning step, which does not measure the distance between the needle tips and the surface of the substrate, until the needle tips make contact with the surface of the substrate. An image of the needle tips is recorded along at least one horizontal imaging direction, which is essentially parallel to the surface of the substrate, and is displayed.

The invention also relates to an arrangement for positioning a probe card as shown in FIG. 8 with probe needles 1, which have needle tips 3 and are arranged on the probe card 5 such that they are oriented in position. In this case, the arrangement has a substrate holder (chuck) 11, a setting (movement) device 12 for adjusting the substrate holder (chuck) 11 relative to the probe card 5, and a recording device 13 whose recording axis 14 is directed at the probe needles 1 and essentially parallel to the substrate surface 15. In this case, the setting (movement) device 12 is provided with a drive device 16 which is provided with a memory 17 that stores a contact position and a separation position.

Substrates 18 having electrically active components, for example semiconductor components, have so-called contact pads which are used to make contact from the outside by means of probe needles. Signals can therefore be applied to these semiconductor components from the outside and the reactions of the latter to these signals can be determined. It thus becomes possible to test these substrates 18. So-called probers 19 are provided for such a test.

Probe needles 1 of probers 19 are fastened either to probe holders or to probe cards 5. When probe holders are used, the probe holders are positioned on a probe holder plate 20 in such a manner that the needle tips of the probe needles are opposite the contact pads in accordance with the pattern assumed by the contact pads.

When probe cards 5 are used the probe needles 1 are fastened to just these probe cards 5 in such a manner that the needle tips 3 of the probe needles 1 are likewise opposite the contact pads in the form of the patterns assumed by these contact pads.

In order to observe the probe needles 1 when contact is being made with the contact pads, DE 103 29 792.8 (corresponding to U.S. Pat. No. 7,057,408) describes an observation device having an observation axis 14 such that the observation axis 14 runs in the gap between the free surface 15 of the wafer (substrate 18) and the holding apparatus or apparatuses 6.

These observation devices can be used to subject the probe needles 1 to precise observation. For example, precisely the extent of overdrive achieved can thus be determined and the movement in the Z direction can be set when an extent has been defined.

In this case, it is expedient for the observation axis 14 to run in an essentially horizontal manner and parallel to the free surface 15 of the wafer (substrate 18). As a result, the holding apparatuses 6 of the components or other components do not obstruct the view of the probe needles 1.

Whereas the relative distance 21 between the needle tips 3 of the probe needles 1 and the surface 15 of the substrate 18 to be tested can be set and is consequently dependent on the setting device 12 which sets this distance 21, for example a substrate clamping apparatus which carries out a movement in a direction perpendicular to the semiconductor surface (Z-direction), the absolute height 22 of the needle tips 3, that is to say the distance between the needle tips and the installation position of the probe holder, for example a probe holder plate, is dependent on the installation or the geometrical configuration of the probe holder.

The substrates 18 are normally tested in a substrate assembly, for example in a semiconductor wafer, on which a plurality of chips are arranged as substrates. In this case, a chip is positioned relative to the needle tips 3 in the lateral direction in such a manner that the needle tips 3 come to rest above the contact pads. Contact is not yet made in this case since, for the purpose of moving the chips relative to the needle tips 3, it is necessary to set a distance 21 between the needle tips and the surface of the substrate in order to avoid the needle tips scratching the surface of the substrate. Only in the test-position is the distance between the needle tips and the surface of the substrate reduced to such an extent that the needle tips 3 on the contact pads carry out a slight scratch, that is to say a slight lateral movement, on the contact pad.

After testing, the next substrate is then approached. In this case, the distance 21 between the needle tips 3 and the surface 15 of the substrate 18 is re-established, the lateral movement is carried out in order to reach the next test position, and contact is made again.

In order to increase the speed, particularly during automatic testing, the two vertical positions, that is to say the first vertical position which is referred to as the "separation position" and the second vertical position which is referred to as the "contact position", are stored and are read out during positioning and are set using the setting device 12.

Since there are no precise details of the exact absolute height 22 of the probe needles 1, these two stored positions no longer correspond to the actual conditions after the probe card 5 has been changed. If work is then continued with the stored positions after the probe card 5 has been changed, this may result in contact being made erroneously, in the needle tips 3 grinding the surface 15 of the substrates 18 in the event of a change in position or in an excessive contact pressure and thus in the destruction of the substrate 18 or the substrate assembly.

The recording device 13 presents an image of the probe needles on a display device 2.

BRIEF SUMMARY OF THE INVENTION

The object of the invention is now to ensure that, after a probe card has been changed, the separation position and the contact position can be adapted to the probe card in a simple manner in order to thus avoid erroneous operation.

This object is achieved with a method according to Claims 1 to 9 and with an arrangement according to Claims 10 to 14.

The invention shall be explained in more detail below using an exemplary embodiment.

BRIEF DESCRIPTION OF DRAWING FIGURES

Figure 1:
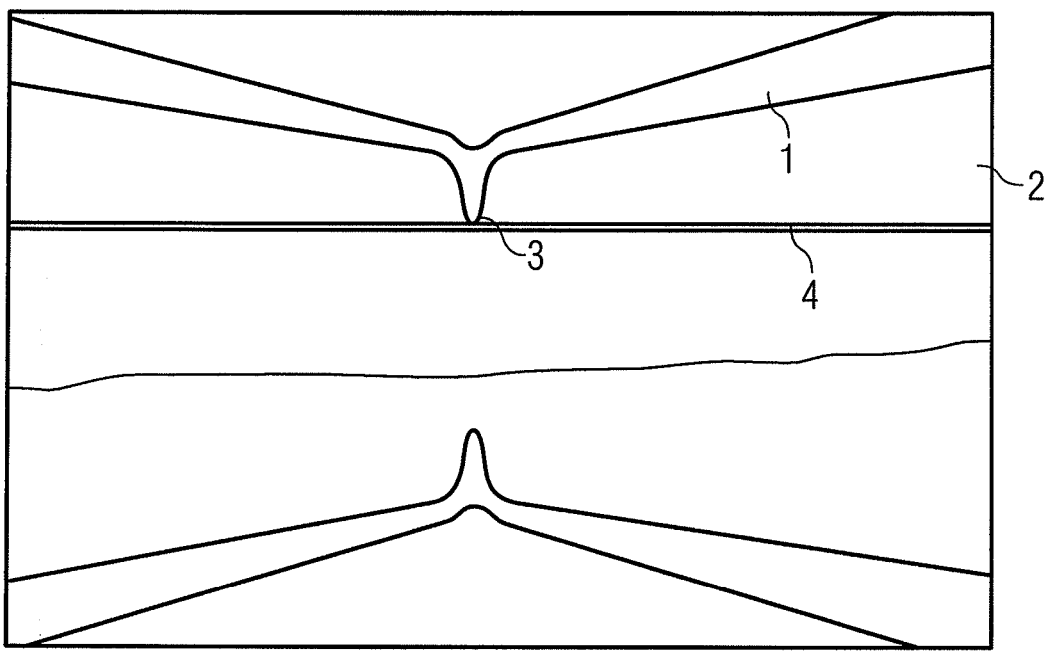
FIG. 1 illustrates an original image on a display.
Figure 8:
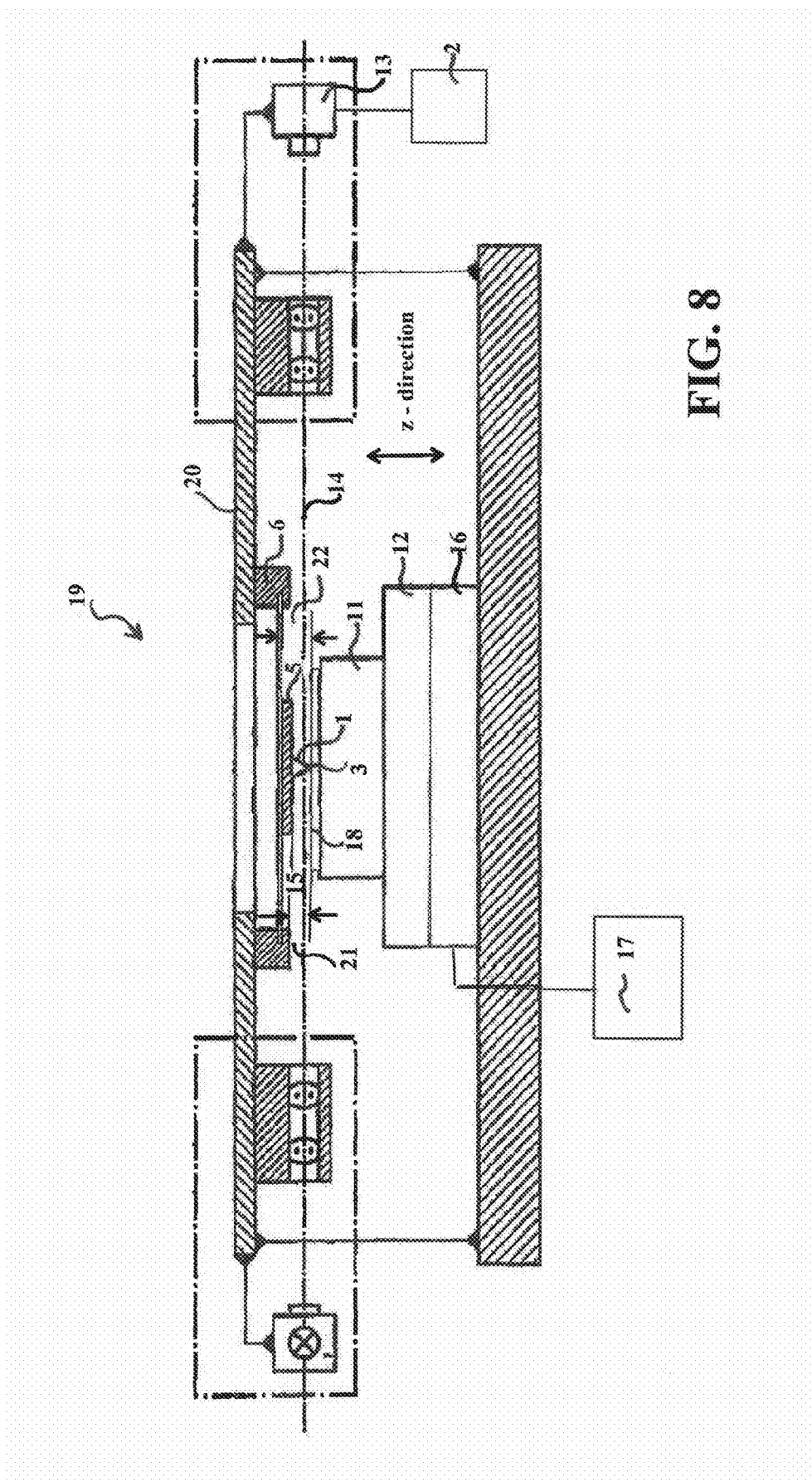
FIG. 8 illustrates a prober that can be employed in implementing the present invention.

As illustrated in FIG. 1, an image capture or recording device such as recording device 13 of FIG. 8 presents an image of the probe needles 1 on a display device 2. In this case, the needle tips 3 are also concomitantly imaged. A so-called probe horizon 4 which is generated by means of computation is also displayed on the display device 2. This probe horizon 4 represents the absolute height of the needle tips 3 and is stored in a memory (such as memory device 17 of FIG. 8).

In FIG. 1 (and FIGS. 2-4), the bottom portion of each view includes a mirror image of the probe needle and tip produced by reflection from the smooth surface of the substrate to be tested. The image and mirror image are separated by a waved line representing a blurred border. The mirror image is not related to the invention and is not discussed further.

Figure 2:
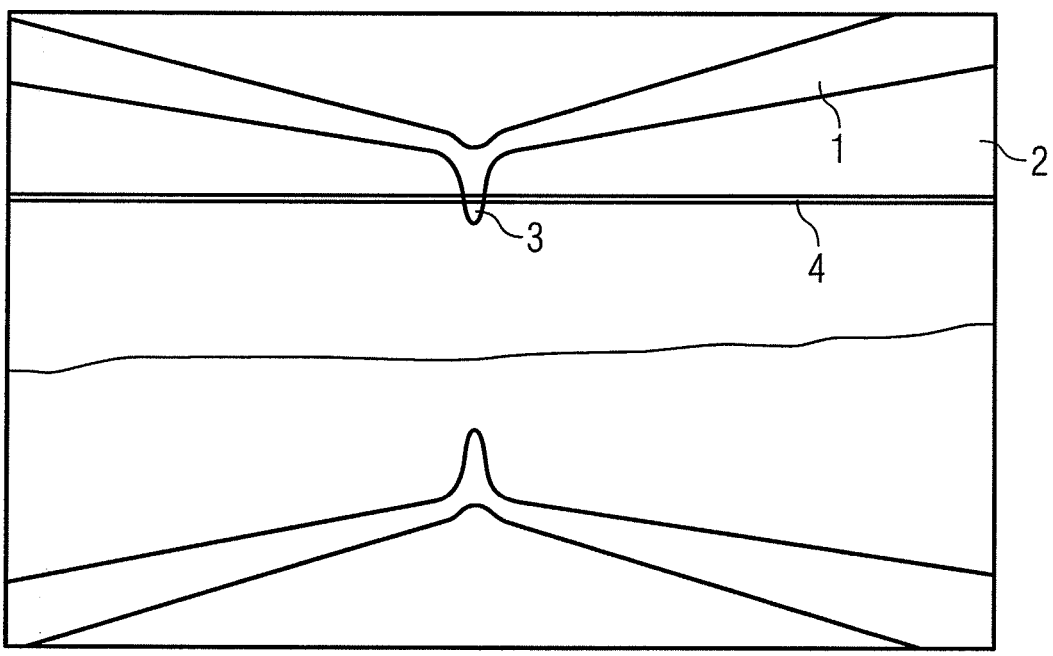
FIG. 2 depicts a displayed image of a newly installed probe card.

FIG. 2 now illustrates the state which occurs after a new probe card has been installed. In the case of the newly installed probe card, the needle tips 3 are lower, due to the manufacturing technology, than in the case of the probe card illustrated in FIG. 1. The stored probe horizon 4 which is equal to the probe horizon 4 in FIG. 1 is thus above the needle tips 3.

The probe horizon 4 is then used to calculate, by means of computation, both the contact position in which the needle tips 3 are in contact with the contact pads of the substrate and the separation position in which the probe needles 1 or rather the needle tips 3 are at a distance from the surface of the substrate, and the setting device is set correspondingly for the substrate holder. If the contact position now no longer corresponds to the actual height of the needle tips 3, this may result in considerable impairment and may go as far as destruction of the substrate.

Figure 3:
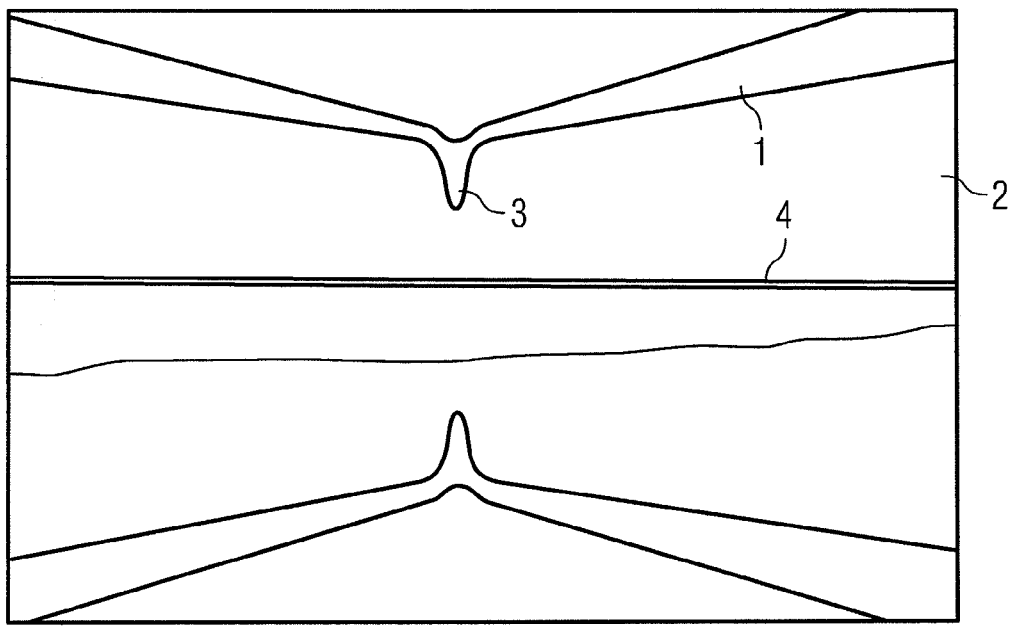
FIG. 3 depicts a displayed image with a repositioned probe horizon.
Figure 4:
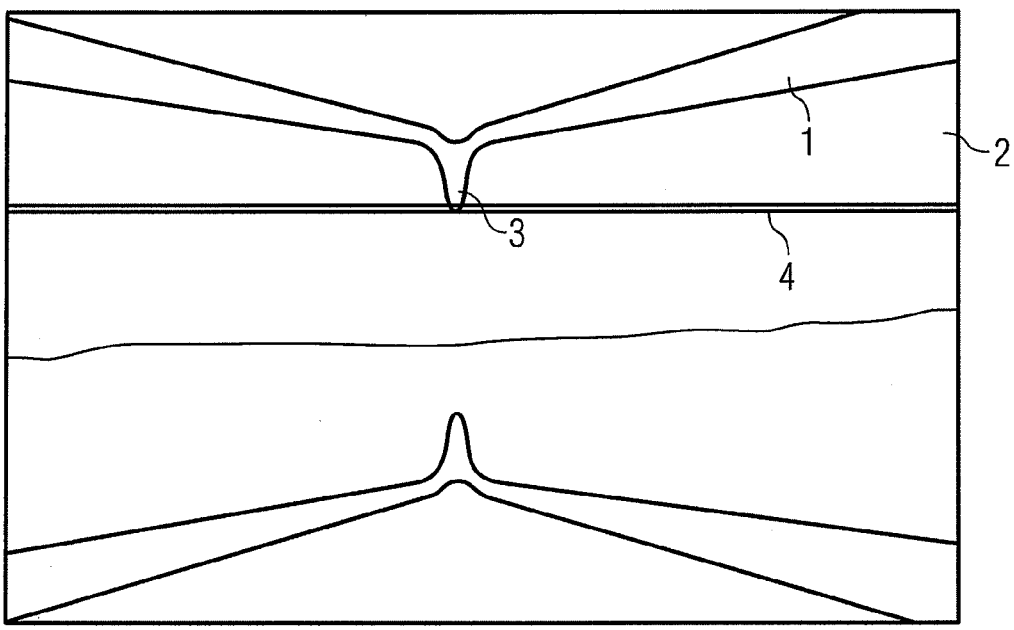
FIG. 4 depicts a displayed image of the repositioned probe horizon at a height of the needle tips.

As illustrated in FIG. 3, input means associated with display device 2 of FIG. 8) can now be used to set the position of the probe horizon 4 in any desired position relative to the needle tips 3. It goes without saying that it is expedient to set the probe horizon 4 at the height of the needle tips 3 again, as illustrated in FIG. 4. The contact position which corresponds to the newly inserted probe card is now also calculated from the setting of the probe horizon 4 in this position.

It is very expedient, in particular when the ratio of the stored probe horizon 4 to the actual position of the needle tips 3 is to be presented in order to thus correct the values which are stored and used for positioning, if the probe card has been changed.

An arrangement as illustrated in FIGS. 5 to 8 is used for this task.

Figure 5:
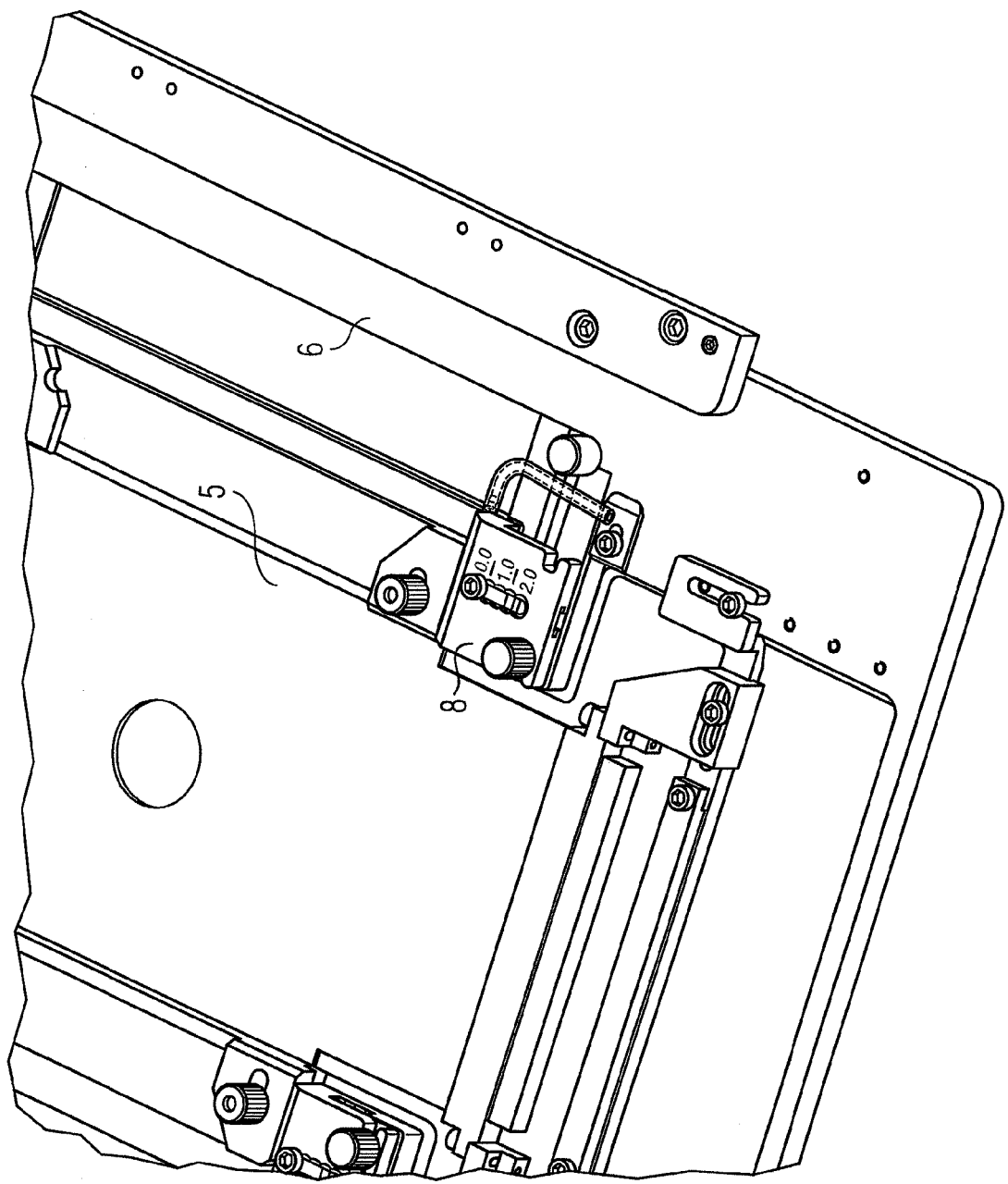
FIG. 5 is a perspective view of a probe card in a probe card holder with a sliding piece and a sensor element.

According to FIG. 5, a probe card 5 which is arranged in a probe card holder 6 is locked using a sliding piece 7.

A sensor piece 8 which is statically connected to the probe card holder is arranged on the sliding piece 7 in the immediate vicinity.

Figure 6:
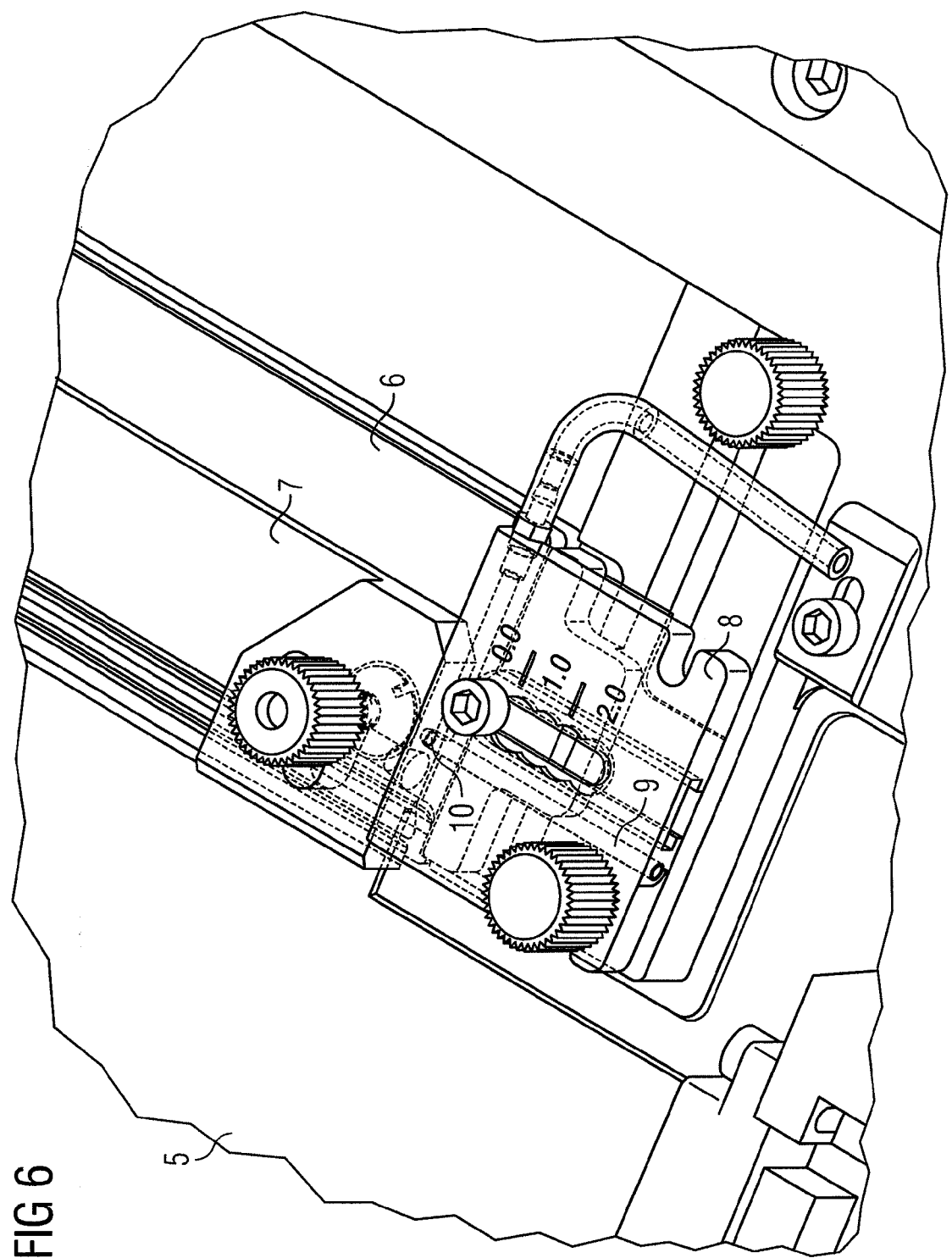
FIG. 6 is an enlarged view of a portion of FIG. 5 showing the sliding piece locked in position.
Figure 7:
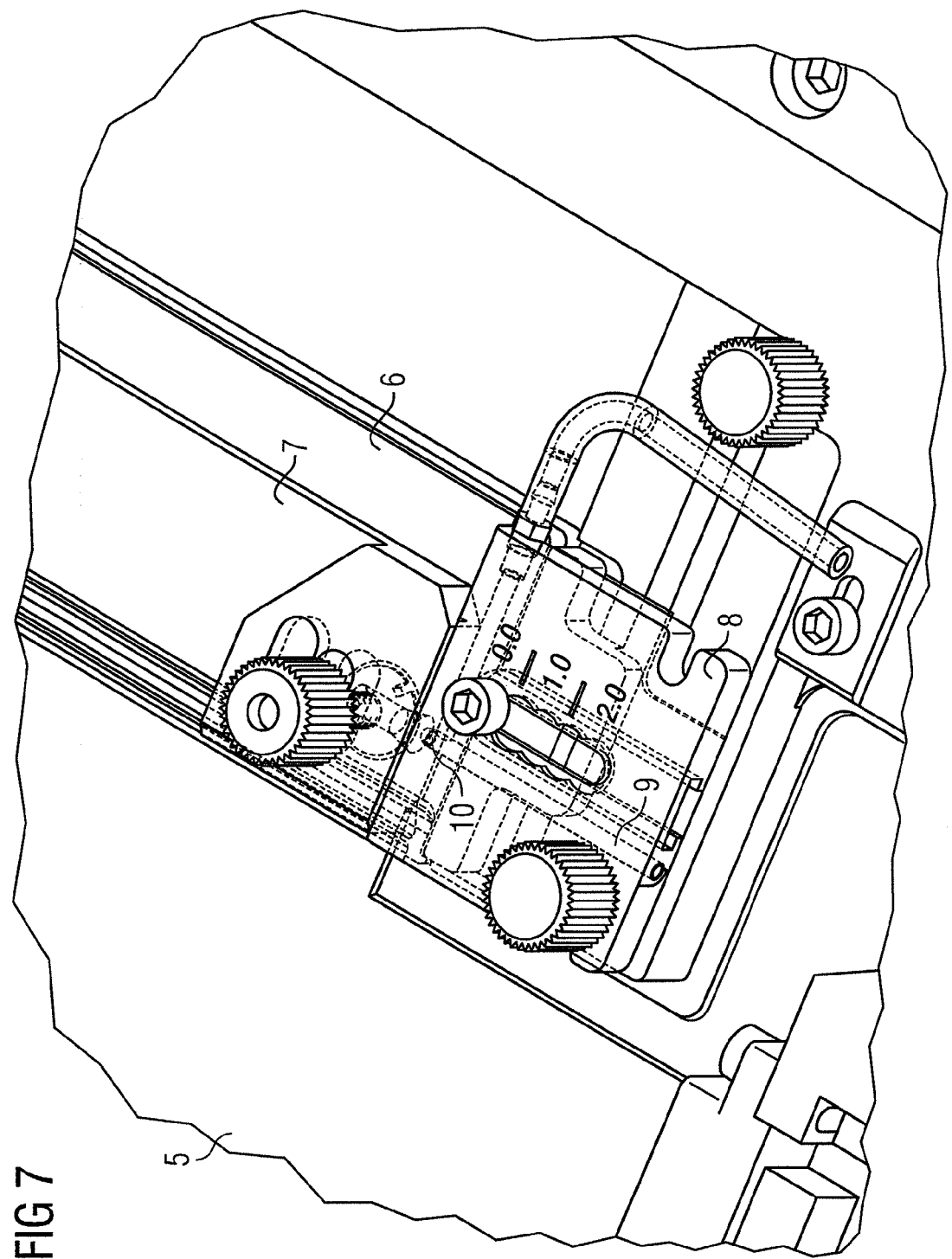
FIG. 7 is an enlarged view of a portion of FIG. 5 showing the sliding piece displaced.

A pressure line 9 which is connected to a vacuum or compressed air source (not illustrated in any more detail) and opens in an opening 10 is arranged in the sensor piece 8. As illustrated in FIG. 6, the opening 10 is closed when the sliding piece 7 is locked.

If the probe card 5 is intended to be removed, it is necessary to displace the sliding piece 8 to such an extent that the probe card 5 can be removed and a new one can be inserted. The opening 10 is thus compulsorily freed. This opening thus generates a pressure difference in the pressure line, which can be measured and detects when the probe card 5 is changed.

Detection of such a change can also be used, inter alia, to give rise to the display shown in FIGS. 1 to 4 and the associated correction of the stored contact position.

What is claimed is:

1. A method for positioning a probe card with probe needles, the needles having needle tips, relative to a surface of a substrate to be tested, in a direction perpendicular to the surface of the substrate, comprising:

measuring and storing a separation position wherein the needle tips are separated from the surface of the substrate, measuring and storing a contact position wherein the needle tips are in contact with the surface of the substrate, recording an image of the needle tips along at least one horizontal imaging direction, which direction is essentially parallel to the surface of the substrate, displaying the recorded image of the needle tips along with the stored contact position or an absolute height of the needle tips which corresponds to the stored contact position, changing the displayed contact position or the displayed absolute height of the needle tips to a new contact position corresponding to a height of the needle tips displayed, storing the new contact position.

2. Method according to claim 1, wherein a new height of the separation position is calculated from the stored new contact position or is calculated using the stored height of the needle tips over a predefined distance and is stored.

3. Method according to claim 1, wherein, when displaying the recorded image of the needle tips, the stored separation position is displayed, and the displayed separation position is changed to a new separation position corresponding to a height of the needle tips displayed, and the new separation position is stored.

4. Method according to claim 1, wherein removal of the probe card from a probe card holder is detected and the stored contact position is displayed when removal has been determined.

5. Method according to claim 4, wherein removal of the probe card is detected if a distance between the probe card and the probe card holder is exceeded.

6. Method according to claim 1, wherein position of the needle tips is electronically determined from imaging of the needle tips and is stored.

7. Method according to claim 6, wherein the new contact position is calculated from the stored position of the needle tips and is stored.

8. Method according to claim 7, wherein the separation position is calculated from the stored position of the needle tips or from the calculated contact position and is stored.

9. Method according to claim 4, wherein, when removal is detected, an error signal is output if a defined difference between the position of the needle tips and the stored contact position is exceeded.

10. Arrangement for positioning a probe card with probe needles, which needles have needle tips and are arranged on the probe card such that the needles are oriented in position, comprising: a substrate holder for holding a substrate to be tested by the probe needles of the probe card, a setting device for adjusting the substrate holder relative to the probe card, an image recording device with a recording axis directed at the probe needles and essentially parallel to a surface of the substrate, the setting device including a drive device having a memory that stores a contact position wherein the needle tips are in contact with the substrate and a separation position wherein the needle tips are separated from the substrate, and a display device that displays a recorded image of the needle tips and the stored contact position and is connected to the memory and to the recording device and has an input means for changing displayed contact position.

11. Arrangement according to claim 10, further comprising means which detects removal of the probe card and is connected to the recording device.

12. Arrangement according to claim 11, further comprising means which detects distance between the probe card and a probe card holder.

13. Arrangement according to claim 11, wherein an opening which is connected to a compressed air source or to a vacuum source by a pressure line is arranged in the probe card holder, said opening being closed when the probe card is inserted in the probe card holder and being open when the probe card has been removed, and the pressure line is connected to a pressure measuring device which detects a pressure difference in the pressure line and, is connected to an evaluation unit which determines a pressure difference.

14. Arrangement according to claim 13, wherein the probe card holder is provided with a sliding piece which locks the probe card and has a position which unlocks the probe card and in which the opening is open and a position which locks the probe card and in which the opening is closed.

* * * * *

UNITED STATES PATENT AND TRADEMARK OFFICE
CERTIFICATE OF CORRECTION

| | | |
|---|---|---|
| PATENT NO. | : 7,733,108 B2 | Page 1 of 1 |
| APPLICATION NO. | : 12/329968 | |
| DATED | : June 8, 2010 | |
| INVENTOR(S) | : Kanev et al. | |

It is certified that error appears in the above-identified patent and that said Letters Patent is hereby corrected as shown below:

Title page, Inventors item (75): Delete "Stefan Kressig" and insert --Stefan Kreissig--

Signed and Sealed this

Twenty-fourth Day of August, 2010

David J. Kappos
*Director of the United States Patent and Trademark Office*